(12) United States Patent
Matsubara

(10) Patent No.: US 9,865,664 B2
(45) Date of Patent: Jan. 9, 2018

(54) THIN FILM TRANSISTOR ARRAY AND MANUFACTURING METHOD OF THE SAME

(71) Applicant: TOPPAN PRINTING CO., LTD., Taito-ku (JP)

(72) Inventor: Ryohei Matsubara, Taito-ku (JP)

(73) Assignee: TOPPAN PRINTING CO., LTD., Taito-ku (JP)

( * ) Notice: Subject to any disclaimer, the term of this patent is extended or adjusted under 35 U.S.C. 154(b) by 0 days.

(21) Appl. No.: 15/242,726

(22) Filed: Aug. 22, 2016

(65) Prior Publication Data

US 2016/0358988 A1 Dec. 8, 2016

Related U.S. Application Data

(63) Continuation of application No. PCT/JP2015/000502, filed on Feb. 4, 2015.

(30) Foreign Application Priority Data

Feb. 21, 2014 (JP) .................................. 2014-032017

(51) Int. Cl.
| | | |
|---|---|---|
| *H01L 27/32* | (2006.01) | |
| *H01L 29/786* | (2006.01) | |
| *H01L 51/05* | (2006.01) | |
| *H01L 51/56* | (2006.01) | |

(Continued)

(52) U.S. Cl.
CPC ...... *H01L 27/3246* (2013.01); *H01L 27/3262* (2013.01); *H01L 27/3272* (2013.01);
(Continued)

(58) Field of Classification Search
CPC ............. H01L 27/3246; H01L 27/3262; H01L 27/3272; H01L 29/786; H01L 51/0516;
(Continued)

(56) References Cited

U.S. PATENT DOCUMENTS 6,163,055 A 12/2000 Hirakata et al.
2001/0000755 A1 5/2001 Hirakata et al.
(Continued)

FOREIGN PATENT DOCUMENTS

JP 10-270707 A 10/1998
JP 2000-147555 A 5/2000
(Continued)

OTHER PUBLICATIONS

International Search Report dated Apr. 21, 2015 in PCT/JP2015/000502, filed Feb. 4, 2015.

*Primary Examiner* — Shahed Ahmed
(74) *Attorney, Agent, or Firm* — Oblon, McClelland, Maier & Neustadt, L.L.P.

(57) ABSTRACT

A thin film transistor array including a substrate, thin film transistors each including a gate electrode formed on the substrate, a source electrode, a drain electrode, a semiconductor layer formed between the source electrode and the drain electrode, an interlayer insulation film formed on the drain electrode, and an upper pixel electrode formed on the interlayer insulation film, and an insulation layer having light shielding property is formed between adjacent upper pixel electrodes.

17 Claims, 7 Drawing Sheets

(51) Int. Cl.
    *H01L 51/00*           (2006.01)
    *H01L 51/10*           (2006.01)
    *G02F 1/1362*          (2006.01)

(52) U.S. Cl.
    CPC ........ H01L 29/786 (2013.01); H01L 51/0516 (2013.01); H01L 51/56 (2013.01); *G02F 1/136209* (2013.01); *G02F 1/136286* (2013.01); *H01L 51/0004* (2013.01); *H01L 51/0022* (2013.01); *H01L 51/102* (2013.01); *H01L 51/107* (2013.01)

(58) Field of Classification Search
    CPC . H01L 51/56; H01L 51/0004; H01L 51/0022; H01L 51/102; H01L 51/107
    USPC ........... 257/13, 21, 53, 79, 83; 438/116, 149
    See application file for complete search history.

(56) References Cited

U.S. PATENT DOCUMENTS

| | | |
|---|---|---|
| 2004/0048408 A1 | 3/2004 | Hirakata et al. |
| 2005/0030461 A1* | 2/2005 | Ono ................... G02F 1/133345 349/141 |
| 2006/0170077 A1 | 8/2006 | Aoki et al. |
| 2008/0252210 A1* | 10/2008 | Banach ............... H01L 51/0023 313/509 |
| 2015/0279870 A1* | 10/2015 | Jiang .................. H01L 29/4908 257/43 |

FOREIGN PATENT DOCUMENTS

| | | |
|---|---|---|
| JP | 2011-37999 A | 2/2011 |
| JP | 2012-004570 A | 1/2012 |

* cited by examiner

THIN FILM TRANSISTOR ARRAY AND MANUFACTURING METHOD OF THE SAME

CROSS-REFERENCE TO RELATED APPLICATIONS

The present application is a continuation of International Application No. PCT/JP2015/000502, filed Feb. 4, 2015, which is based upon and claims the benefits of priority to Japanese Application No. 2014-032017, filed Feb. 21, 2014. The entire contents of these applications are incorporated herein by reference.

BACKGROUND OF THE INVENTION

Field of the Invention

The present invention relates to a thin film transistor array and a manufacturing method of the same.

Discussion of the Background

Due to the remarkable development of information technology, nowadays, information is frequently transmitted and received with laptop computers or portable information terminals. It is common knowledge that a ubiquitous society enabling information to be exchanged anywhere will be attained in the near future. In such a society, a lighter and slim information terminal is desired.

Currently, silicon-based materials are mainly employed as semiconductor materials, and photolithography is generally used as a manufacturing method.

In recent years, printable electronics in which an electrical component is manufactured by using a printing technique are attracting attention. By using the printing technique, the following advantages can be attained, that is, equipment cost and manufacturing cost are reduced compared to using the photolithography and, since a vacuum and high temperature environment are not necessary, a plastic substrate can be used. The printing process efficiently utilizes materials and involves neither a developing process nor an etching process, producing a smaller amount of liquid waste. Accordingly, the environmental load caused by use of printing methods is small.

However, use of printing methods is likely to bring about low pattern definition and low alignment accuracy compared to the photolithography. In particular, in the case where a thick film having a thickness on the order of several micrometers is required, screen printing is often used. However, in this case, a high definition pattern is difficult to be formed from the view point of the fluidity of the paste.

It has been known that the thin film transistors change their semiconductor characteristics, when irradiated with light. Hence, it is considered that light shielding layers should be provided. However, in the case where a light shielding layer is formed by using a printing method, if a high resolution pattern cannot be formed or high alignment accuracy cannot be achieved, the light shielding properties are insufficient. As a result, the thin film transistor may not operate properly.

As a printing method having a resolution higher than that of screen printing, gravure offset printing can be used (e.g., PTL 1). In gravure offset printing, a pattern is formed via a silicone blanket. When the paste is transferred onto the silicone blanket from an intaglio, solvent is absorbed by the blanket to lower the fluidity. As a result, the resolution is improved.

However, in the case where a pattern-formed region is wider than a non-pattern-formed region such as in an upper pixel electrode pattern, the amount of solvent absorbed by the silicone blanket increases, causing a change in the time taken for lowering the fluidity or causing lowering of the alignment accuracy due to swelling of the blanket.

PTL 1: JP-A-2011-37999

SUMMARY OF THE INVENTION

According to one aspect of the present invention, a thin film transistor array includes a substrate, thin film transistors each including a gate electrode formed on the substrate, a source electrode, a drain electrode, a semiconductor layer formed between the source electrode and the drain electrode, an interlayer insulation film formed on the drain electrode, and an upper pixel electrode formed on the interlayer insulation film, and an insulation layer having light shielding property is formed between adjacent upper pixel electrodes.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 1:
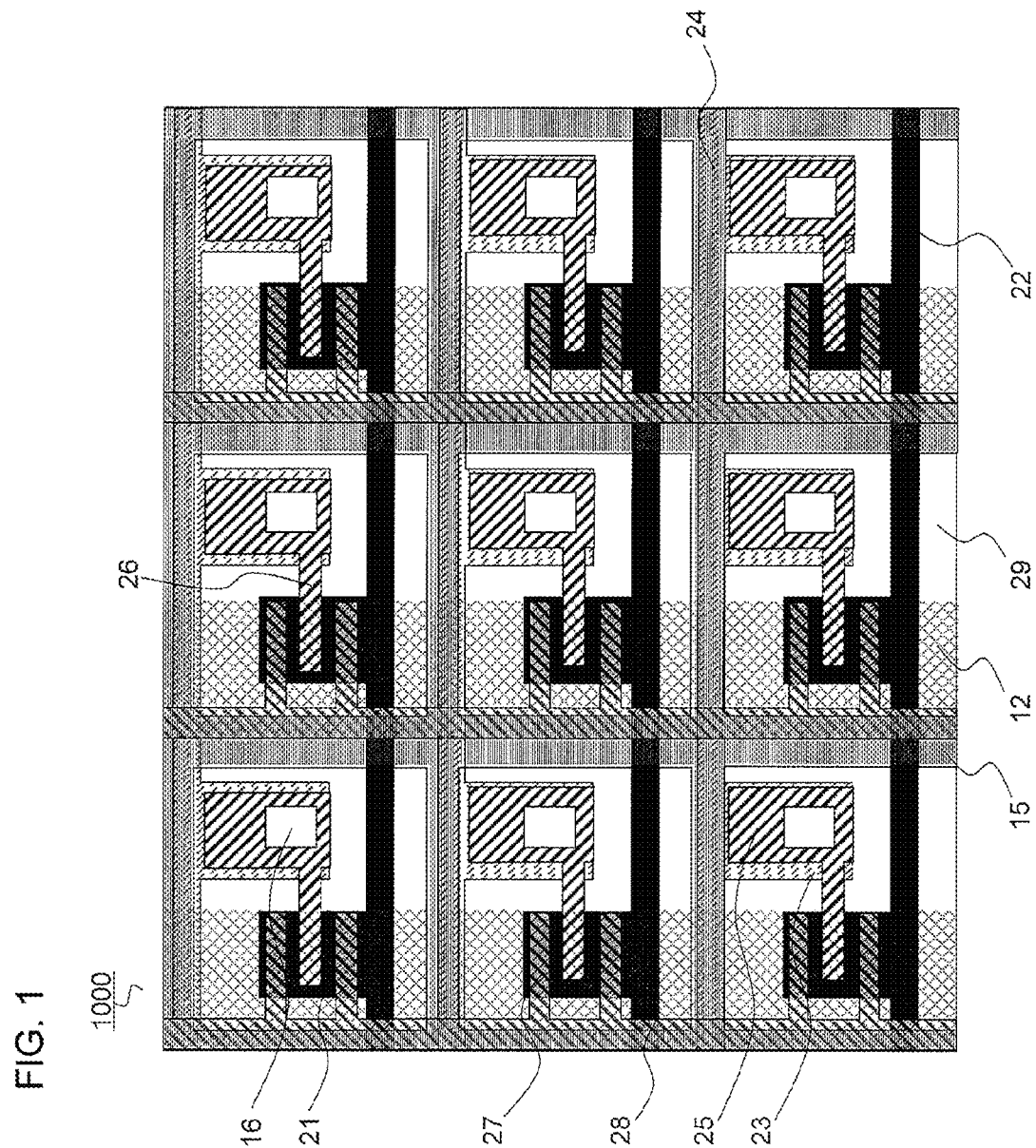
FIG. 1 is an overall schematic diagram showing a thin film transistor array according to a first embodiment of the present invention.

The embodiments will now be described with reference to the accompanying drawings, wherein like reference numerals designate corresponding or identical elements throughout the various drawings.

First Embodiment

Hereinafter, with reference to FIGS. 1 to 4, a first embodiment will be described.

Figure 2:
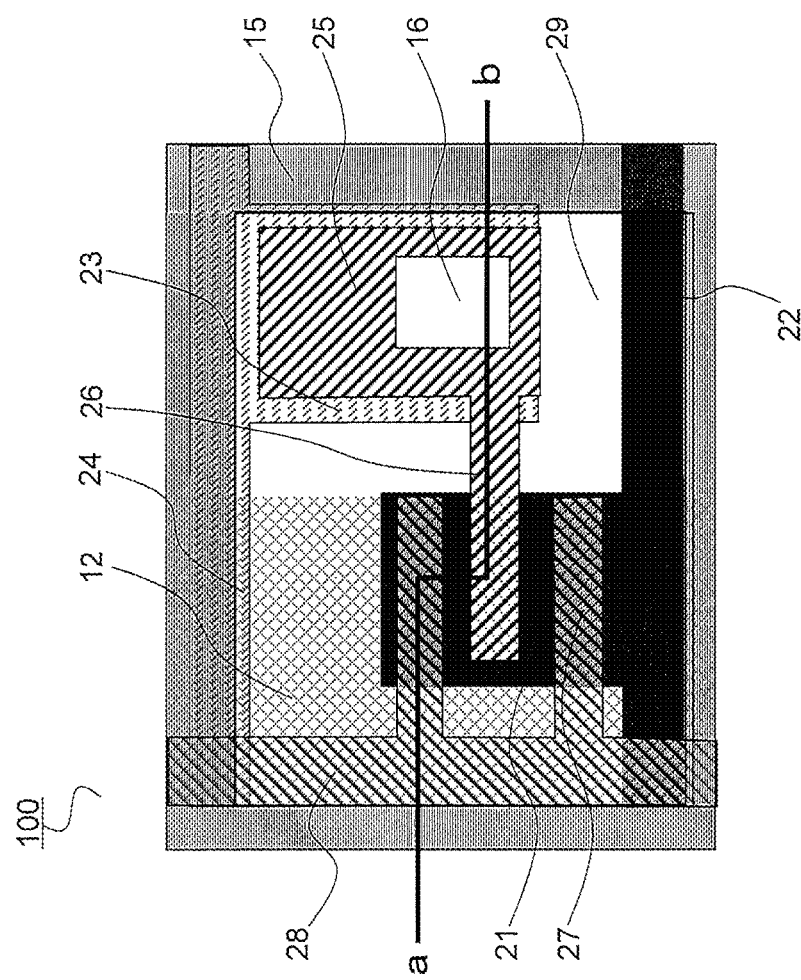
FIG. 2 is an enlarged diagram of one pixel shown in FIG. 1.
Figure 3:
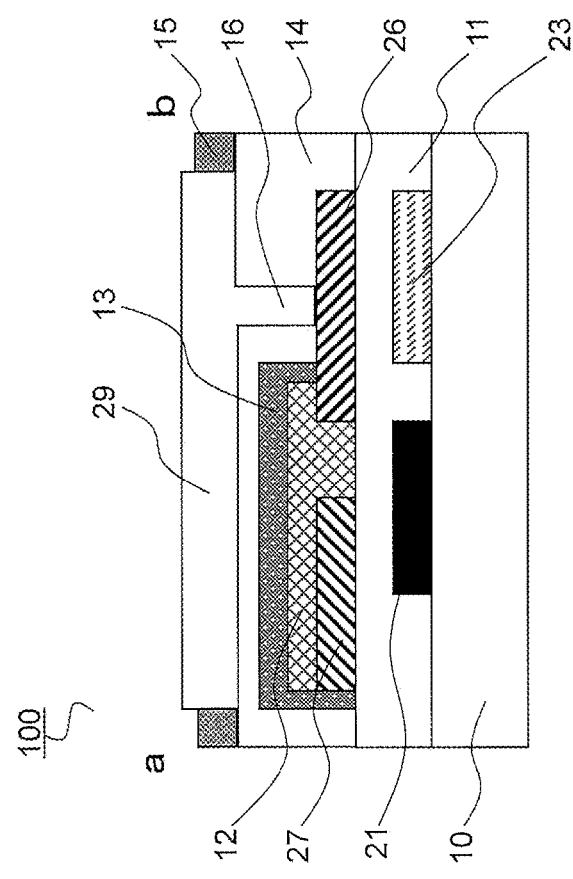
FIG. 3 is a diagram showing a cross sectional view taken along the a-b line of FIG. 2.
Figure 4:
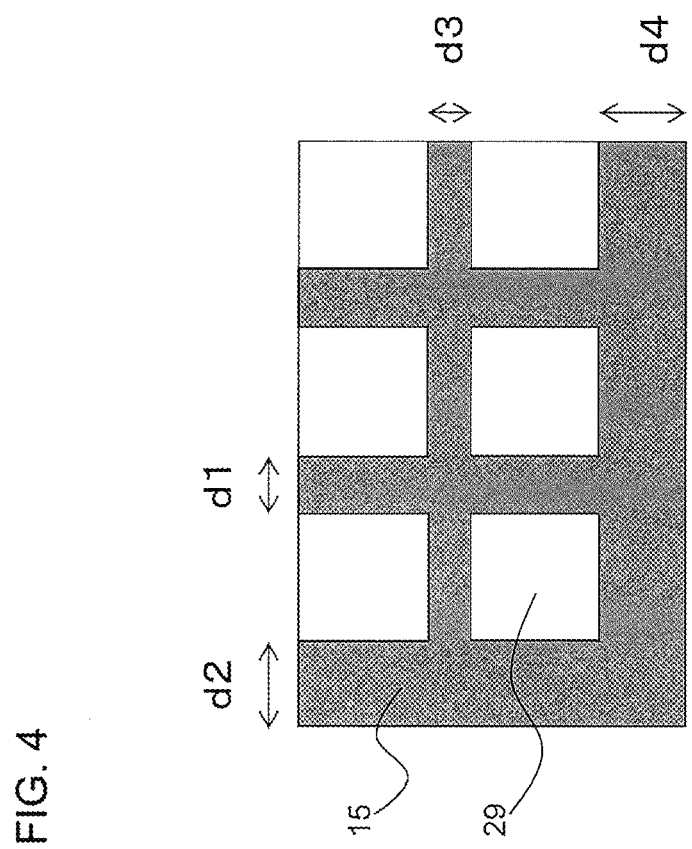
FIG. 4 is an overall schematic diagram showing an outer periphery of a thin film transistor array according to the first embodiment of the present invention.

FIG. 1 is a schematic diagram of a thin film transistor array 1000. FIG. 2 is an enlarged diagram for one pixel shown in FIG. 1. FIG. 3 is a diagram showing a cross sectional view taken along the a-b line of FIG. 2. FIG. 4 is a schematic diagram showing an outer periphery of the thin film transistor array 1000.

As shown in FIGS. 1 to 3, the thin film transistor array 1000 is provided with a substrate 10; a plurality of thin film transistors each including, on the substrate 10, at least a gate electrode 21, a gate insulation film 11, a source electrode 27, a drain electrode 26, a semiconductor layer 12 formed between the source electrode 27 and the drain electrode 26, an interlayer insulation film 14 and an upper pixel electrode 29; a gate wiring 22 connected to the gate electrode 21; and a source wiring 28 connected to the source electrode 27. An insulation layer 15 having light shielding properties is formed between adjacent pixel electrodes 29.

The present embodiment further includes a sealing layer 13, a via portion 16, a capacitor electrode 23, a capacitor wiring 24 and a pixel electrode 25, which may be provided optionally as needed.

Hereinafter, each of the elements of the thin film transistor array 1000 will be described.

A flexible substrate is desirably used as the substrate 10 having insulation properties. Materials generally used for the substrate include, for example, plastic materials including polyethylene terephthalate (PET), polyimide, polyethersulfone (PES), polyethylene naphthalate (PEN) and polycarbonate can be used. A glass substrate, quartz, a silicon substrate or the like can be used as the substrate having insulation properties. However, considering reduction in the thickness and weight and achievement of flexibility, a plastic substrate is preferably used. Also, considering the temperature used for manufacturing processes, PEN or polyimide is desirably used as the substrate.

Materials used for electrodes are not specifically limited. Materials typically used for electrodes include thin films made of metals such as gold, platinum, nickel; thin films made of oxide such as indium tin oxide; a conductive polymer including poly (ethylenedioxythiphene)/polystyrene sulfonate (PEDOT/PSS) and polyaniline; a solution in which metal colloidal particles such as of gold or silver or nickel are dispersed; and a thick film paste using metal particles such as silver as a conductive material.

Methods of forming the electrodes are not specifically limited, but dry film-forming such as deposition or sputtering may be used. However, considering flexibility and cost reduction, wet film-forming is desirably used, including screen printing, reverse offset printing, letterpress printing and ink-jet printing.

As a material for the upper pixel electrode 29, a material having light shielding properties is preferably used so as to shield thin film transistor portions. As an index of the light shielding properties, an optical density (OD value) is preferably 1 or more per film thickness 1 μm in a wavelength region from 300 nm to 1000 nm. It should be noted that the OD value is measured by using a microspectroscope (MCPD2000 manufactured by Otsuka Electronics Co., Ltd) and can be obtained by the following equation (1).

$$OD\ value = \log_{10}(I0/I) \quad (1)$$

where I0 is incident light intensity, and I is transmitted light intensity.

Forming methods of the upper pixel electrode 29 are not specifically limited. However, considering flexibility and cost reduction, wet film-forming is desirably used, including screen printing, gravure offset printing, reverse offset printing, letterpress printing and ink-jet printing. Considering via filling, screen printing or gravure offset printing is preferably used, which can form the upper pixel electrode 29 with a large thickness.

As shown in FIG. 3, the upper pixel electrode 29 is preferably a thick film thicker than the insulation layer 15 having light shielding properties, which will be described later. Thus, for example, when liquid crystal, organic EL or electrophoretic type display device is stacked onto the thin film transistor array 1000, the upper pixel electrode 29 can readily contact with an electrode portion of the display device. Further, when the insulation layer 15 having light shielding properties is formed by ink-jet printing after forming the upper pixel electrode 29, the insulation layer 15 having light shielding properties is prevented from flowing onto the surface of the upper pixel electrode 29, thereby keeping the conductivity thereof.

When the upper pixel electrode 29 has liquid repellency, publicly-known liquid repellent material can be used, including fluorine compounds such as fluoroalkyl group-containing polymers or monomers, and silicone compounds. As liquid repellency, the contact angle of the upper pixel electrode with respect to the material of the insulation layer 15 having light shielding properties is preferably 45 degrees or more. Using the liquid repellency on the surface of the upper pixel electrode 29, the insulation layer 15 can be easily and selectively formed between adjacent upper pixel electrodes 29. The insulation layer 15 having light shielding properties will be described later.

Materials used for the gate insulation film 11 are not specifically limited. Materials typically used for the gate insulation film 11 includes resins such as polyvinyl phenol, poly methyl methacrylate, polyimide, polyvinyl alcohol and epoxy resin, and inorganic compounds in which particles such as of alumina or silica gel are dispersed. Further, a thin film made of PET or PEN, or PES may be used for the gate insulation film 11.

Methods of forming the gate insulation film 11 are not specifically limited, but dry film-forming methods, such as deposition or sputtering, may be used. However, considering flexibility and cost reduction, a wet film-forming method is desirably used, including screen printing, reverse offset printing, letterpress printing or ink-jet printing.

Materials used for the semiconductor layer 12 are not specifically limited. Materials typically used for the semiconductor layer 12 includes silicon semiconductor materials such as amorphous silicon; oxide semiconductor materials such as InGaZnO; high-molecular-weight organic semiconductor materials such as polythiophene, polyallylamine, fluorenebithiophene-copolymer and derivatives thereof; and low-molecular-weight organic semiconductor materials such as pentacene, tetracene, copper phthalocyanine, perylene and derivatives thereof. However, to achieve cost reduction, flexibility and area increase, an organic semiconductor material to which a printing process can be applied is desirably used. Moreover, carbon compounds such as carbon nano-tubes or fullerene, or a semiconductor nano-sized particle dispersion may be used as a semiconductor material.

As printing methods to form the organic semiconductor layer, publicly-known methods including gravure printing, offset printing, screen printing and ink-jet printing can be used. Generally, since the above-mentioned organic semiconductor materials have low solubility in a solvent so that printing methods suitable for low viscosity solution are desirably used. Such printing methods include letterpress printing, reverse offset printing, ink-jet printing and dispensing. In particular, the letterpress printing is most preferable since the printing period is short and an amount of ink used is small, and is suitable for printing a stripe pattern. A semiconductor layer formed in a stripe pattern can average the distribution of film thickness variation in the stripe pattern, the unevenness being caused by the unevenness of an anilox roll. Hence, the film thickness of the semiconductor layer becomes constant and TFT properties can be made uniform.

Materials used for the interlayer insulation film 14 are not specifically limited. Materials typically used for the interlayer insulation film 14 include acrylic resins, epoxy resins, and organic/inorganic hybrid resins. For the forming method, photolithography can be used in addition to various printing methods such as screen printing, gravure printing and gravure offset printing. To achieve cost reduction and area increase, a printing method is more preferably used. Particularly, a gravure offset printing method which is capable of forming a fine pattern with a relatively large film thickness is most preferably used.

Materials used for the insulation layer 15 having light shielding properties are not specifically limited. However, materials containing a black colorant are preferably used. As the black colorant, for example, mention can be made of carbon black, titanium carbon, iron oxide, titanium oxide, graphite or the like.

Methods of forming the insulation layer 15 having light shielding properties are not specifically limited. For example, a forming method using photolithography can be used in addition to various printing methods such as ink-jet printing, gravure offset printing, screen printing and reverse offset printing. To achieve cost reduction and area increase, a printing method is more preferably used.

In particular, when the insulation layer 15 is formed after forming the upper pixel electrode 29, the insulation layer 15 having light shielding properties is formed by using an ink-jet printing. As a result, without using a photo mask, the insulation layer 15 having light shielding properties can be selectively formed between adjacent upper pixel electrodes 29. The upper pixel electrode 29 is used as a division wall so that the insulation layer 15 having light shielding properties can be prevented from being wet-spread.

Further, as shown in FIG. 1, the insulation layer 15 having light shielding properties is formed between adjacent upper pixel electrodes 29. Thus, light transmitting through the gap between adjacent upper pixel electrodes 29 can be minimized. Hence, light reaching the thin film transistors is reduced, whereby the thin film transistors can be stably operated.

When the insulation layer 15 having light shielding properties has liquid repellency, publicly-known liquid repellent material can be used, including fluorine compounds such as fluoroalkyl group-containing polymers or monomers, and silicone compounds. As liquid repellency, a contact angle of the insulation layer 15 with respect to the material of the upper pixel electrode is preferably 45 degrees or more. When the upper pixel electrode 29 is formed after forming the insulation layer 15 having light shielding properties, a gap between adjacent upper pixel electrodes 29 can readily be formed, by utilizing the liquid repellency on the surface of the insulation layer 15 having light shielding properties.

The optical density (OD value) of the insulation layer 15 having light shielding properties is preferably 1 or more per film thickness 1 μm in a wavelength region of from 300 nm to 1000 nm. Thus, quantity of light arriving at a portion of the thin film transistors is reduced to 10% or less. Semiconductor materials used for an active layer include amorphous silicon, oxide semiconductors and organic semiconductors. Since most of these materials have absorption properties in a wavelength region from 300 nm to 1000 nm, the thin film transistors can operate stably by reducing the quantity of light to 10% or less.

In the present embodiment, structure of the thin film transistor is not specifically limited. For example, the structure of the thin film transistor can be of a top gate type or a bottom gate type.

There are portions where adjacent upper pixel electrodes 29 are not formed in the outer periphery of the thin film transistor array 1000. In this case, as shown in FIG. 4, it is desirable to form the insulation layer 15 having the light shielding properties outside the upper pixel electrode 29 with approximately the same shape as the insulation layer 15 formed between adjacent pixel electrodes 29, or in an area wider than the gap between the upper pixel electrodes 29. In other words, as shown in FIG. 4, it is preferable that d2 is set to not less than d1, and d4 is set to not less than d3. It should be noted that a width between the upper pixel electrodes 29 in the horizontal direction of FIG. 4 is defined as d1, a width of the outer periphery in the horizontal direction of FIG. 4 is defined as d2, a width between the upper pixel electrodes 29 in the vertical direction shown in FIG. 4 is defined as d3, and a width of the outer periphery in the vertical direction shown in FIG. 4 is defined as d4.

In the upper pixel electrode 29, a dummy pattern may be provided in an outer peripheral region of the thin film transistor array 1000, where the thin film transistors are not formed. In this case, the insulation layer 15 having light shielding properties may be or may not be formed between the upper pixel electrodes 29 in the region where the dummy pattern is formed.

Distance between adjacent upper electrodes 29 (i.e., d1 and d3 in FIG. 4) may be within a range from 10 μm to 150 μm, inclusive. Thus, for example, when an electrophoretic type display is driven by the thin film transistor array 1000, good display contrast can be obtained. When the distance between adjacent upper pixel electrodes increases to 150 μm or more, a region where the display cannot be driven becomes larger so that the contrast will be lowered. On the other hand, in the case where the upper pixel electrode 29 is formed with a printing method, if the distance between adjacent upper pixel electrodes is small, short circuiting is likely to occur between the upper pixel electrodes 29. Therefore, the distance between adjacent pixel electrodes is more preferably set to 50 μm or more.

In the thin film transistor array 1000, a sealing layer, a gas barrier layer and a flattened film may be formed as needed. Especially, when an organic semiconductor material is used as the semiconductor layer 12, depending on the material of the interlayer insulation film 14, the semiconductor layer 12 may possibly be damaged by the solvent or the like. Hence, as shown in FIG. 3, the sealing layer 13 is preferably provided.

Also, in the thin film transistor array 1000, names of source and drain are used for convenience's sake, and thus can be named conversely. According to the present embodiment, an electrode connected to the source wiring 28 is referred to as the source electrode 27, and an electrode connected to the pixel electrode 25 is referred to as the drain electrode 26.

Second Embodiment

Figure 5:
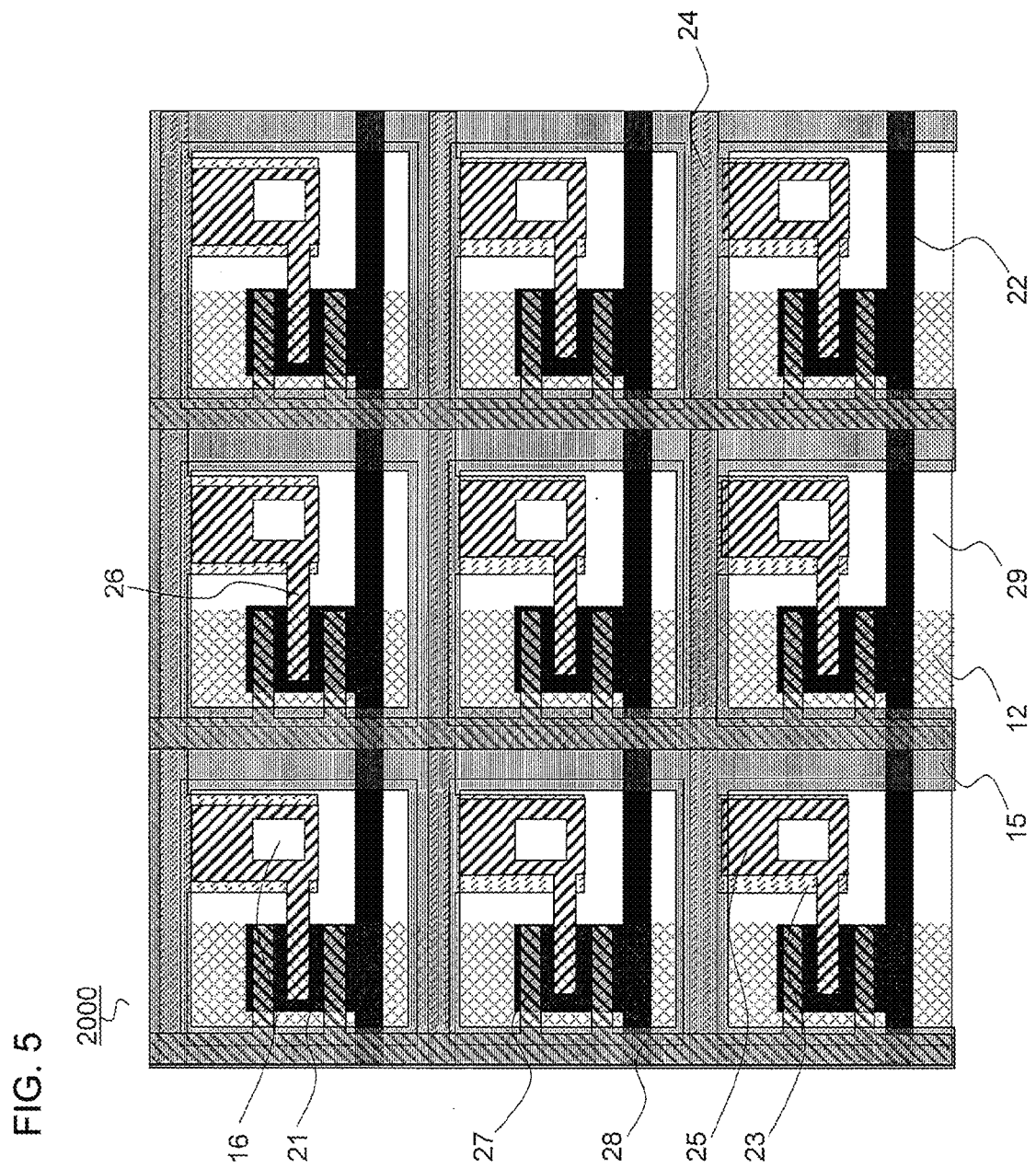
FIG. 5 is an overall schematic diagram showing a thin film transistor array according to a second embodiment of the present invention.
Figure 6:
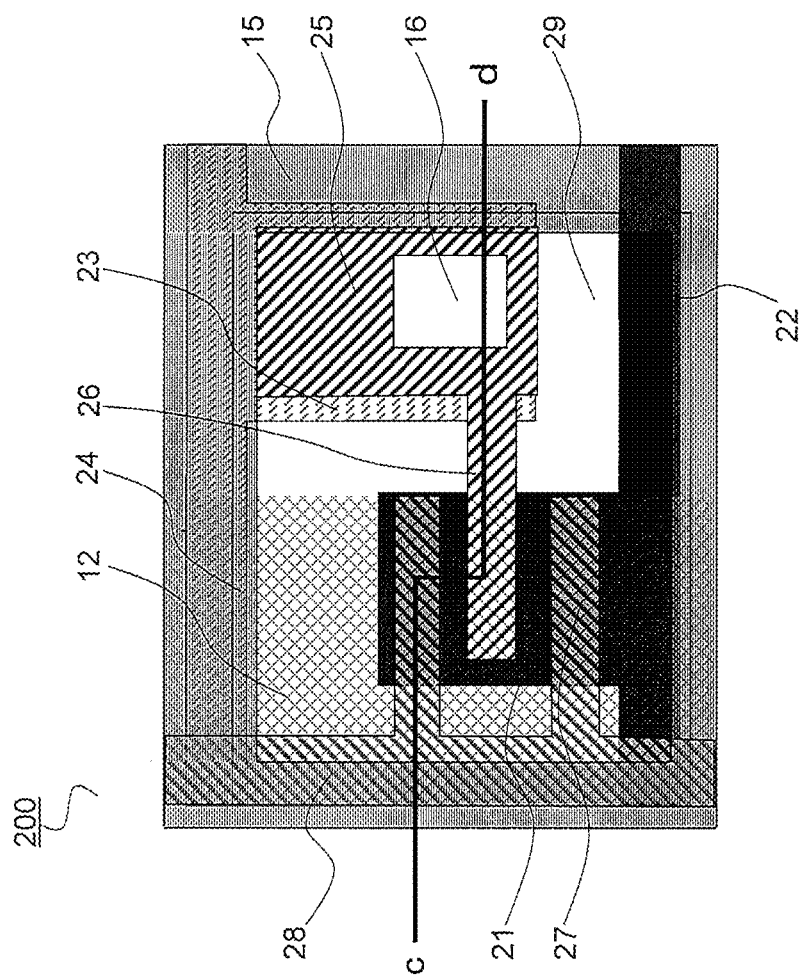
FIG. 6 is an enlarged diagram of one pixel shown in FIG. 4.
Figure 7:
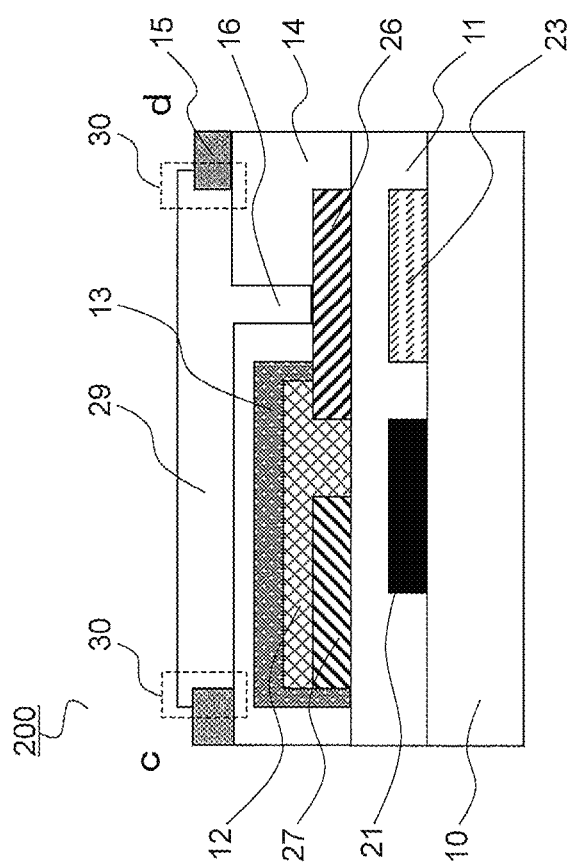
FIG. 7 is a diagram showing a cross sectional view taken along the c-d line of FIG. 5.

Hereinafter, with reference to FIGS. 5 to 7, a second embodiment will be described. FIG. 5 is an overall schematic diagram showing a thin film transistor array 2000, FIG. 6 is an enlarged diagram of one pixel shown in FIG. 5. FIG. 7 is a diagram showing a cross sectional view taken along the c-d line of FIG. 6.

As shown in FIG. 7, the thin film transistor array 2000 is different from that of the first embodiment in that the thin film transistor array 2000 has a laminate structure 30 in which a part of the upper pixel electrode 29 is laminated to a part of an insulation layer 15 having light shielding properties (a region surrounded by the dotted line in FIG. 7). Since the rest of the configuration is the same as that of the first embodiment, repetitive explanation is omitted.

Since a part of the upper pixel electrode 29 is laminated to a part of the insulation layer 15 having light shielding properties are laminated, whereby light is prevented from being transmitted through the gap between the upper pixel electrode 29 and the insulation layer 15 having light shielding properties. Therefore, the thin film transistors can operate more stably.

The above-described features of the thin film transistor arrays according to the respective embodiments can be appropriately combined or partly omitted for implementation.

Examples will be described as follows.

Example 1

In the present example, a bottom-gate/bottom-contact type thin film transistor array 1000 was produced.

A polyethylene naphthalate (PEN) film was used for the substrate 10. Ink-jet printing using an ink in which silver nanoparticles were dispersed was used to form a gate electrode 21, a gate wiring 22, a capacitor electrode 23 and a capacitor wiring 24. As a gate insulation film, a polyimide was coated by means of a die coater, followed by drying for one hour at 180° C. so as to form a gate insulation film 11.

Then, ink-jet printing was performed using the ink in which silver nanoparticles were dispersed to form a source electrode 27, a drain electrode 26, a source wiring 28 and a pixel electrode 25. As a semiconductor material, 6, 13-Bis (triisopropylsilylethynyl) pentacene (TIPS-pentacene) (manufactured by Aldrich corporation) was used. This material was dissolved at 2 wt % into tetralin for use as an ink. As a letterpress, a photosensitive resin letterpress was used to perform letterpress printing using an anilox roll of 150 LPI to print a stripe-pattern semiconductor, followed by drying for 60 minutes at 100° C. so as to form a semiconductor layer 12.

Next, as a sealing material, CYTOP (manufactured by Asahi Glass Co., Ltd) was used to perform screen printing, followed by drying for 90 minutes at 100° C., thereby forming a sealing layer 13.

Next, as an interlayer insulation material, epoxy resin was coated by means of a die coater, followed by exposure and development so as to form the interlayer insulation film 14 and the via portion 16.

Next, a silver paste was used as a material for the upper pixel electrode to form the upper pixel electrode 29 using screen printing. Although the distance between adjacent upper pixel electrodes was 100 μm as designed, the distance between the formed patterns ranged from 50 μm minimum to 90 μm maximum.

Next, a novolac resin was used to form, with ink-jet printing, the insulation layer 15 having light shielding properties between the upper pixel electrodes, the novolac resin containing carbon black as an insulation material having light shielding properties.

It should be noted that the film thickness of the upper pixel electrode was 5 μm and the film thickness of the insulation layer having light shielding properties was 1 μm, and the optical densities thereof in a wavelength region from 300 nm to 1000 nm were 5 and 3, respectively.

Transistor characteristics were measured, by means of a solar simulator, irradiating light of 1 SUN to the thin film transistor array 1000. As a result, no abnormal characteristics were detected such as a change in threshold voltage or an increase of ON/OFF current.

Example 2

In the present example, a bottom-gate/bottom-contact type thin film transistor array as described in the second embodiment was produced, in which a part of the upper pixel electrode 29 was laminated to an insulation layer 15 having light shielding properties.

Similar manufacturing steps as the first example were used up to the step of forming the upper pixel electrode 29.

Next, as an insulating material having light shielding properties, a carbon black-containing novolac resin was coated by means of a die coater, followed by performing photolithography to form the insulation layer 15 having light shielding properties, with the upper pixel electrode 29 being overlapped therewith by 5 μm as designed. It should be noted that the film thickness of the upper pixel electrode is 5 μm and the film thickness of the insulation layer having light shielding properties is 1 μm, and the optical densities thereof in a wavelength region from 300 nm to 1000 nm were 5 and 4 respectively.

Transistor characteristics were measured, by means of a solar simulator, irradiating light of 1 SUN to the thin film transistor array 2000. As a result, no abnormal characteristics were detected such as a change in the threshold voltage or an increase of ON/OFF current.

Example 3

In the present example, the bottom-gate/bottom-contact type thin film transistor array 1000 was produced, which was described in the first embodiment. Up to the step of forming the interlayer insulation film 14 and the via portion 16, manufacturing steps similar to the first example 1 were used.

Next, as an insulation layer material having light shielding properties, a material obtained by adding a fluoroalkyl group-containing oligomer to a novolac carbon black-containing resin was coated by means of a die coater, followed by patterning with photolithography to form the insulation layer 15 having light shielding properties. At this time, the line widths d1 and d3 of the insulation layer having light shielding properties were 20 μm.

Next, a silver paste was used as a material for the upper pixel electrode to form the upper pixel electrode 29 by screen printing. In this case, since the surface of the insulation layer 15 having light shielding properties repels the silver paste, the distance between adjacent upper pixel electrode was 20 μm. Similar to the examples 1 and 2, no abnormal characteristics were detected.

Comparative Example 1

In the present comparative example, the insulation layer 15 having light shielding layer was not formed, and the rest of the configuration was similar to that of the example 1. As a result, when the transistor characteristics were measured by means of a solar simulator, irradiating light of 1 SUN to the thin film transistor array, compared to the case where light was not irradiated, the threshold voltage was shifted by 10 V to positive side, the amount of ON current was doubled and OFF current was increased 10 times, resulting in abnormal operation.

Comparative Example 2

The present comparative example was similar to the example 1 except that the optical density of the insulation layer 15 having light shielding properties was 0.5. As a result, when the transistor characteristics were measured by means of a solar simulator, irradiating light of 1 SUN to the thin film transistor array, compared to the case where light was not irradiated, the threshold voltage was shifted by 4 V to positive side, the amount of ON current was increased 1.3 times and OFF current was increased 4 times, resulting in abnormal operation.

Comparative Example 3

The present comparative example was similar to the example 1 except that the optical density of upper pixel electrode 29 was 0.5. As a result, when the transistor characteristics were measured by means of a solar simulator, irradiating light of 1 SUN to the thin film transistor array, compared to the case where light was not irradiated, the threshold voltage was shifted by 6 V to positive side, the amount of ON current was increased 1.5 times and OFF current was increased 6 times, resulting in abnormal operation.

Comparative Example 4

The present comparative example was similar to the example 2 except that the optical density of the insulation layer 15 having light shielding properties was 1 per film thickness 1 μm in a wavelength region from 300 nm to 1000 nm. As a result, when the transistor characteristics were measured by means of a solar simulator, irradiating light of 1 SUN to the thin film transistor array, compared to the case where light was not irradiated, the threshold voltage was shifted by 2 V to positive side, the amount of ON current was increased 1.2 times and OFF current was increased 2.5 times, resulting abnormal operation.

Comparative Example 5

The present comparative example is similar to the example 2 except that the optical density of the insulation layer 15 having light shielding properties is 1 per film thickness 1 μm in a wavelength region from 300 nm to 600 nm and 0.1 per film thickness 1 μm in a wavelength region from 600 nm to 1000 nm. As a result, when transistor characteristics were measured by means of a solar simulator, irradiating light of 1 SUN to the thin film transistor array, compared to the case where light was not irradiated, the threshold voltage was shifted by 2 V to positive side, the amount of ON current was increased 1.2 times and OFF current was increased 2.5 times, resulting in abnormal operation.

An aspect of the present invention is to provide a thin film transistor array, that does not suffer abnormal operation due to light irradiation, and a manufacturing method, even when an upper pixel electrode is formed by using a printing method.

A thin film transistor array according to an embodiment of the present invention is provided with a substrate; a plurality of thin film transistors each including, on the substrate, at least a gate electrode, a gate insulation film, a source electrode, a drain electrode, a semiconductor layer formed between the source electrode and the drain electrode, an interlayer insulation film, and an upper pixel electrode; a gate wiring connected to the gate electrode; and a source wiring connected to the source electrode. An insulation film having light shielding properties is formed between adjacent upper pixel electrodes.

A part of the upper pixel electrode and a part of the insulation layer having light shielding properties may be laminated.

Either one of surfaces of the upper pixel electrode or the insulation layer having light shielding properties may have liquid repellency.

The upper pixel electrode may be a thick film thicker than the insulation layer having light shielding properties provided between the adjacent upper pixel electrodes.

Optical densities of the upper pixel electrode and the insulation film having light shielding properties may preferably be 1 or more per film thickness 1 μm in a wavelength region from 300 nm to 1000 nm.

Distance between the adjacent upper pixel electrodes may be within a range from 10 μm to 150 μm.

In a manufacturing method of the thin film transistor array according to an embodiment of the present invention, the insulation layer having light shielding properties is formed by using an ink-jet printing.

In a manufacturing method of the thin film transistor array according to an embodiment of the present invention, the upper pixel electrode is formed by using screen printing.

As described above, according to an embodiment of the present invention, the insulation layer having light shielding properties is formed between adjacent upper pixel electrodes. Hence, light transmission through the gap between upper pixel electrodes can be minimized. As a result, light arriving at the thin film transistors is reduced, whereby the thin film transistor can be stably operated.

Thin film transistor array and manufacturing method of the thin film transistor array according to an embodiment of the present invention can be applied effectively, for example, to a technical field related to display devices, and is useful, in particular, in the field of flexible display devices.

REFERENCE SIGNS LIST

10: substrate
11: gate insulation layer
12: semiconductor layer
13: sealing layer
14: interlayer insulation film
15: insulation layer having light shielding properties
16: via portion
21: gate electrode
22: gate wiring
23: capacitor electrode
24: capacitor wiring
25: pixel electrode
26: drain electrode
27: source electrode
28: source wiring
29: upper pixel electrode
30: laminate structure
100, 200 thin film transistor
1000, 2000 thin film transistor array Obviously, numerous modifications and variations of the present invention are possible in light of the above teachings. It is therefore to be understood that within the scope of the appended claims, the invention may be practiced otherwise than as specifically described herein.

What is claimed is:
1. A thin film transistor array, comprising:
a substrate;
a plurality of thin film transistors each including a gate electrode formed on the substrate, a source electrode, a drain electrode, a semiconductor layer formed between the source electrode and the drain electrode, an inter- layer insulation film formed on the drain electrode, and an upper pixel electrode formed on the interlayer insulation film; and an insulation layer having light shielding property is formed between adjacent upper pixel electrodes and is formed entirely outside an area directly above the gate electrode with the substrate being below the gate electrode.

2. The thin film transistor array of claim 1, wherein the upper pixel electrode has a portion laminated on a portion of the insulation layer.

3. The thin film transistor array of claim 1, wherein at least one of the upper pixel electrode and the insulation layer has a surface having liquid repellency.

4. The thin film transistor array of claim 1, wherein the upper pixel electrode is thicker than the insulation layer.

5. The thin film transistor array of claim 1, wherein the upper pixel electrode and the insulation layer each have an optical density of 1 or more per film thickness at 1 μm in a wavelength region from 300 nm to 1000 nm.

6. The thin film transistor array of claim 1, wherein the adjacent upper pixel electrodes are positioned at a distance in a range of from 10 μm to 150 μm.

7. The thin film transistor array of claim 1, wherein each of the thin film transistors further includes a gate insulation film formed on the gate electrode.

8. The thin film transistor array of claim 7, further comprising:
a gate wiring connected to the gate electrode; and
a source wiring connected to the source electrode.

9. The thin film transistor array of claim 8, wherein the upper pixel electrode has a portion laminated on a portion of the insulation layer.

10. The thin film transistor array of claim 9, wherein at least one of the upper pixel electrode and the insulation layer has a surface having liquid repellency.

11. The thin film transistor array of claim 10, wherein the upper pixel electrode is thicker than the insulation layer.

12. The thin film transistor array of claim 11, wherein the upper pixel electrode and the insulation layer each have an optical density of 1 or more per film thickness at 1 μm in a wavelength region from 300 nm to 1000 nm.

13. The thin film transistor array of claim 12, wherein the adjacent upper pixel electrodes are positioned at a distance in a range of from 10 μm to 150 μm.

14. A method of manufacturing the thin film transistor array of claim 1, comprising:

forming the plurality of thin film transistors each including the gate electrode on the substrate, the source electrode, the drain electrode, the semiconductor layer between the source electrode and the drain electrode, the interlayer insulation film on the drain electrode, and the upper pixel electrode on the interlayer insulation film; and performing ink-jet printing such that the insulation layer is formed between the adjacent upper pixel electrodes.

15. A method of manufacturing the thin film transistor array of claim 1, comprising:

forming the plurality of thin film transistors each including the gate electrode on the substrate, the source electrode, the drain electrode, the semiconductor layer between the source electrode and the drain electrode, the interlayer insulation film on the drain electrode, and the upper pixel electrode on the interlayer insulation film; and performing screen printing such that the insulation layer is formed between the adjacent upper pixel electrodes.

16. The method of manufacturing the thin film transistor array of claim 7, comprising:

forming the plurality of thin film transistors each including the gate electrode on the substrate, the gate insulation film on the gate electrode, the source electrode, the drain electrode, the semiconductor layer between the source electrode and the drain electrode, the interlayer insulation film on the drain electrode, and the upper pixel electrode on the interlayer insulation film; and performing ink-jet printing such that the insulation layer is formed between the adjacent upper pixel electrodes.

17. The method of manufacturing the thin film transistor array of claim 8, comprising:

forming the plurality of thin film transistors each including the gate electrode on the substrate, the gate insulation film on the gate electrode, the source electrode, the drain electrode, the semiconductor layer between the source electrode and the drain electrode, the interlayer insulation film on the drain electrode, and the upper pixel electrode on the interlayer insulation film;

forming the gate wiring connected to the gate electrode;

forming the source wiring connected to the source electrode; and performing ink-jet printing such that the insulation layer is formed between the adjacent upper pixel electrodes.

* * * * *